US 011683044B2

(12) United States Patent
Wada et al.

(10) Patent No.: US 11,683,044 B2
(45) Date of Patent: Jun. 20, 2023

(54) WIRELESS POWER TRANSMITTING DEVICE

(71) Applicant: Mitsubishi Electric Corporation, Tokyo (JP)

(72) Inventors: Osamu Wada, Tokyo (JP); Hideyuki Nakamizo, Tokyo (JP); Hiroshi Otsuka, Tokyo (JP); Yukihiro Homma, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/849,907

(22) Filed: Jun. 27, 2022

(65) Prior Publication Data

US 2022/0337256 A1 Oct. 20, 2022

Related U.S. Application Data

(63) Continuation of application No. PCT/JP2020/006582, filed on Feb. 19, 2020.

(51) Int. Cl.
| | | |
|---|---|---|
| *H03L 7/18* | (2006.01) |
| *H02J 50/20* | (2016.01) |
| *H02J 50/40* | (2016.01) |
| *H02J 50/70* | (2016.01) |
| *H03L 7/085* | (2006.01) |
| *H03L 7/099* | (2006.01) |

(52) U.S. Cl.
CPC ............... *H03L 7/18* (2013.01); *H02J 50/20* (2016.02); *H02J 50/40* (2016.02); *H02J 50/70* (2016.02); *H03L 7/085* (2013.01); *H03L 7/099* (2013.01)

(58) Field of Classification Search
CPC .. H03L 7/18; H03L 7/085; H03L 7/099; H02J 50/20; H02J 50/40; H02J 50/70
See application file for complete search history.

(56) References Cited

U.S. PATENT DOCUMENTS

| 7,580,691 B1 * | 8/2009 | Reed ...................... H04B 15/06 |
| | | 455/260 |
| 7,877,060 B1 * | 1/2011 | Khlat .................... H03F 1/3282 |
| | | 455/67.11 |

(Continued)

FOREIGN PATENT DOCUMENTS

| CN | 115336183 A | * 11/2022 | ........... H04B 1/0483 |
| JP | 2013-543111 A | 11/2013 | |

(Continued)

OTHER PUBLICATIONS

Office Action issued in Japanese Patent Application No. 2021-571957, dated Jan. 11, 2022.

(Continued)

*Primary Examiner* — Adam D Houston
(74) *Attorney, Agent, or Firm* — Birch, Stewart, Kolasch & Birch, LLP

(57) ABSTRACT

In a wireless power transmitting device, a control circuit outputs a control signal for setting a frequency and a phase of an F-PLL signal generated by an F-PLL, the F-PLL generates the F-PLL signal having the frequency and the phase set by the control signal output from the control circuit, and a frequency conversion circuit generates a transmission signal by converting a frequency of the F-PLL signal generated by the F-PLL.

2 Claims, 3 Drawing Sheets

(56) References Cited

U.S. PATENT DOCUMENTS

| | | |
|---|---|---|
| 9,225,507 B1 | 12/2015 | Lye et al. |
| 10,756,798 B2* | 8/2020 | Berg ................... H04B 7/0617 |
| 10,873,363 B2* | 12/2020 | Gollakota ......... H04W 74/0808 |
| 11,133,916 B2* | 9/2021 | Huang ................ H01Q 21/065 |
| 2008/0106339 A1 | 5/2008 | Adlerstein |
| 2008/0280581 A1* | 11/2008 | Rofougaran ............ H04B 7/10 455/296 |
| 2010/0093279 A1* | 4/2010 | Linsky .............. H04W 52/0245 455/41.2 |
| 2012/0062286 A1 | 3/2012 | Ginsburg et al. |
| 2014/0097986 A1* | 4/2014 | Xue ........................ H01Q 3/34 342/372 |
| 2014/0191815 A1* | 7/2014 | Mirzaei .................. H03L 7/099 331/1 A |
| 2019/0020385 A1 | 1/2019 | Hongo |
| 2019/0113610 A1* | 4/2019 | Vacanti ................ G01S 13/583 |
| 2019/0386716 A1 | 12/2019 | Uchida |
| 2020/0083894 A1 | 3/2020 | Tsutsumi et al. |
| 2020/0292659 A1* | 9/2020 | Bai ....................... G01S 13/931 |
| 2020/0341108 A1* | 10/2020 | Heller ..................... G01S 7/034 |
| 2022/0337256 A1* | 10/2022 | Wada ..................... H02J 50/20 |

FOREIGN PATENT DOCUMENTS

| | | |
|---|---|---|
| WO | WO 2017/187541 A1 | 11/2017 |
| WO | WO 2018/163333 A1 | 9/2018 |
| WO | WO 2019/008672 A1 | 1/2019 |
| WO | WO-2020264459 A1 * | 12/2020 ............. H01Q 1/288 |

OTHER PUBLICATIONS

Office Action issued in Japanese Patent Application No. 2021-571957, dated Mar. 29, 2022.

Tajima, et al., "Frequency and Phase Difference Control Using Fractional-N PLL Synthesizers by Composition of Control Data," IEEE Transactions on Microwave Theory and Techniques, vol. 55, No. 12, Dec. 2007, pp. 2832-2838.

* cited by examiner

WIRELESS POWER TRANSMITTING DEVICE

CROSS REFERENCE TO RELATED APPLICATIONS

This application is a Continuation of PCT International Application No. PCT/JP2020/006582, filed on Feb. 19, 2020, which is hereby expressly incorporated by reference into the present application.

TECHNICAL FIELD

The present disclosure relates to a wireless power transmitting device.

BACKGROUND ART

In the wireless power transmitting device, for example, an active phased array antenna (APAA) system, which is often adopted in a radar or a wireless communication system, is used. As an example of a wireless device using the conventional APAA system, a phased array system is described in Patent Literature 1. The phased array system includes a local oscillator as a signal source and a plurality of transceivers each including a phase shifter, a multiplier, and a radiator. In the phased array system, the radio frequency signal generated by the local oscillator is distributed and input to each transceiver. In each transceiver, the phase shifter phase-shifts the input radio frequency signal, the multiplier multiplies the frequency of the signal phase-shifted by the phase shifter, and the radiator transmits, as a transmission signal, a signal obtained by multiplying the frequency by the multiplier. The phased array system controls the phase of the transmission signal transmitted by the radiator by controlling the phase shift amount of the phase shifter for each transceiver. As a result, the phased array system forms a beam in a target transmission direction by interference between transmission signals.

Note that since the above-described multiplier multiplies the frequency of the signal phase-shifted by the phase shifter, the frequency of each of the output signals of the local oscillator and the phase shifter is different from the frequency of the transmission signal transmitted by the radiator. As a result, the transmission signal is prevented from sneaking to the path of the output signal of the local oscillator and interfering with the output signal, or the transmission signal is prevented from sneaking to the path of the output signal of the phase shifter and interfering with the output signal. Note that the term "interference" in the present specification means a phenomenon in which a signal of a certain frequency is combined with another signal of the same frequency in the wireless power transmitting device and a shift from a target phase occurs unless otherwise noted.

CITATION LIST

Patent Literature

Patent Literature 1: Japanese National Patent Publication No. 2013-543111

SUMMARY OF INVENTION

Technical Problem

In a case where the configuration of the phased array system described in Patent Literature 1 is applied to a wireless power transmitting device, in the wireless power transmitting device, an output signal of a signal source sneaks to a path of an output signal of a phase shifter and interferes with the output signal of the phase shifter, so that a phase of the output signal of the phase shifter deviates from a target phase. Besides, in the wireless power transmitting device, the output signal of the phase shifter sneaks to the path of the output signal of the signal source and interferes with the output signal of the signal source, so that the phase of the output signal of the signal source deviates from the target phase.

The present disclosure has been made to solve the above problems, and an object of the present disclosure is to provide a technique capable of suppressing interference between signals of the identical frequency in a wireless power transmitting device.

Solution to Problem

A wireless power transmitting device according to the present disclosure includes: a plurality of transmission circuits to each generate a transmission signal; and a plurality of antennas to each output the transmission signal generated by a corresponding one of the plurality of transmission circuits, wherein each of the plurality of transmission circuits includes a control circuit, an F-PLL, and a frequency conversion circuit, the control circuit outputs a control signal for setting a frequency and a phase of an F-PLL signal generated by the F-PLL, the F-PLL generates the F-PLL signal having the frequency and the phase set by the control signal output from the control circuit, and the frequency conversion circuit generates the transmission signal by converting a frequency of the F-PLL signal generated by the F-PLL.

The plurality of transmission circuits includes a first transmission circuit and a second transmission circuit, the plurality of antennas includes a first antenna connected to the first transmission circuit and a second antenna connected to the second transmission circuit, the first transmission circuit includes a first control circuit, a first F-PLL, and a first frequency conversion circuit, the first control circuit outputs a first control signal for setting a frequency and a phase of a first F-PLL signal generated by the first F-PLL by setting a setting pattern of a frequency division number in the first F-PLL, the first F-PLL generates the first F-PLL signal having a frequency and a phase set by the first control signal output from the first control circuit, the first frequency conversion circuit generates a first transmission signal by converting the frequency of the first F-PLL signal generated by the first F-PLL, the first antenna outputs the first transmission signal generated by the first frequency conversion circuit, the second transmission circuit includes a second control circuit, a second F-PLL, and a second frequency conversion circuit, the second control circuit outputs a second control signal for setting a frequency and a phase of a second F-PLL signal generated by the second F-PLL by setting a setting pattern of a frequency division number in the second F-PLL, the second F-PLL generates the second F-PLL signal having the frequency and the phase set by the second control signal output from the second control circuit, the second frequency conversion circuit generates a second transmission signal by converting a frequency of the second F-PLL signal generated by the second F-PLL, and the second antenna outputs the second transmission signal generated by the second frequency conversion circuit.

The frequency of the first F-PLL signal generated by the first F-PLL is the same as the frequency of the second F-PLL signal generated by the second F-PLL, the first frequency conversion circuit and the second frequency conversion circuit have a same multiplication number or frequency division number, and a frequency of the first transmission signal generated by the first frequency conversion circuit and output from the first antenna is the same as a frequency of the second transmission signal generated by the second frequency conversion circuit and output from the second antenna.

A phase of the first F-PLL signal generated by the first F-PLL is the same as a phase of the second F-PLL signal generated by the second F-PLL, and the setting pattern of the frequency division number in the first F-PLL set by the first control signal output from the first control circuit and the setting pattern of the frequency division number in the second F-PLL set by the second control signal output from the second control circuit are different from each other.

Advantageous Effects of Invention

According to the present disclosure, it is possible to suppress interference between signals of the identical frequency in the wireless power transmitting device.

DESCRIPTION OF EMBODIMENTS

Figure 1:
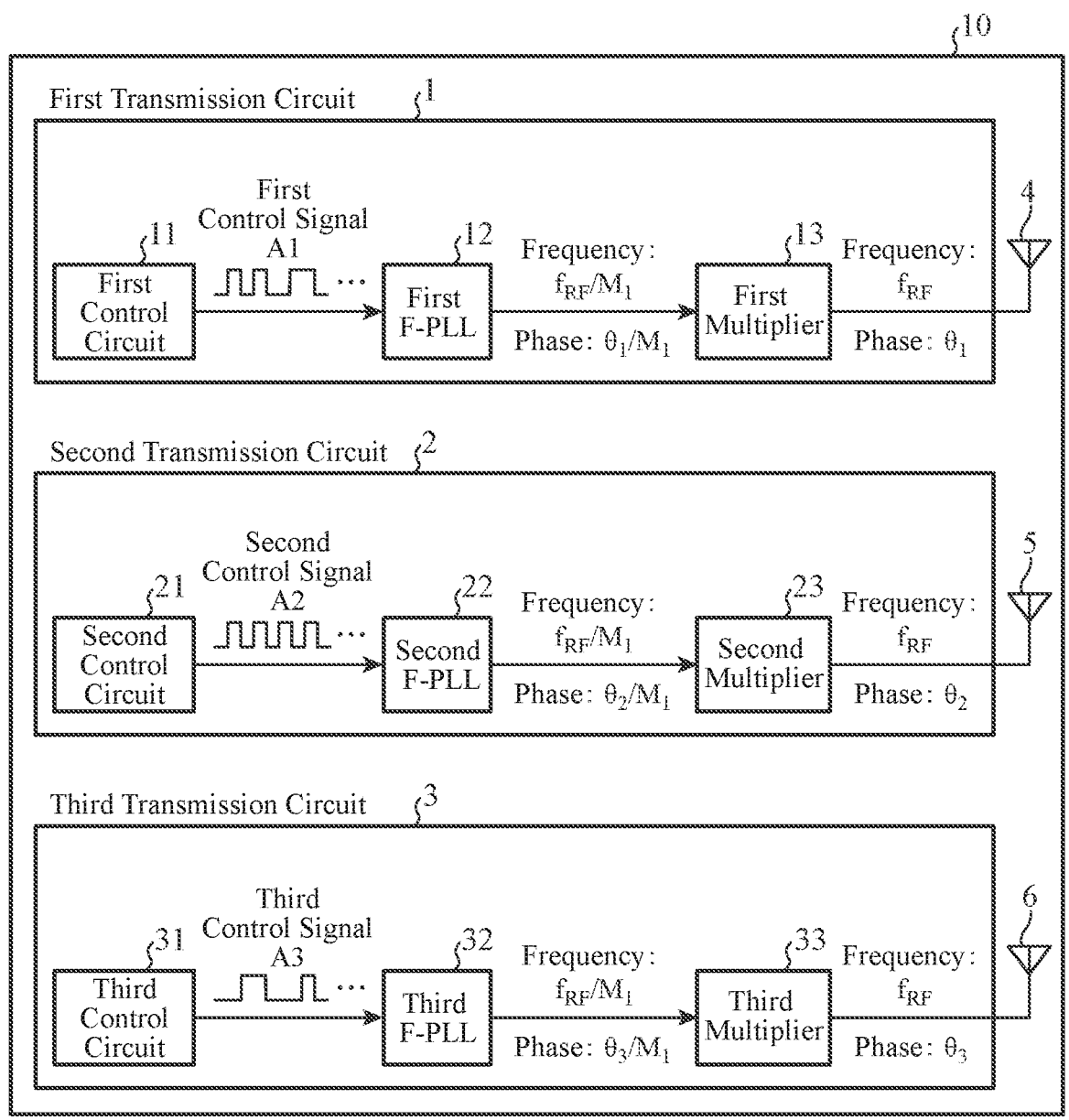
FIG. 1 is a block diagram showing a configuration of a wireless power transmitting device according to a first embodiment.

A wireless power transmitting device wirelessly transmits power to a device or circuit located at a remote location. For example, the wireless power transmitting device includes a signal source that generates a radio frequency signal and an antenna that transmits a radio frequency transmission signal based on the radio frequency signal. In a case where the wireless power transmitting device having such a configuration is adopted, a reception device that receives the radio frequency transmission signal as power receives the radio frequency transmission signal by an antenna, and converts the radio frequency transmission signal into a DC signal by a diode or the like.

For example, when the reception device as described above is a mobile object, and the wireless power transmitting device transmits power to the mobile object, the wireless power transmitting device needs to change the transmission direction of the transmission signal depending on the position of the mobile object. In order to implement this, for example, the above-described APAA system is used for the wireless power transmitting device. In the APAA system, the wireless power transmitting device includes a plurality of antennas, controls the phase or amplitude of the transmission signal for each antenna, and forms a beam in a target transmission direction by interference between the transmission signals.

In wireless power transmission, power conversion efficiency of a reception device that receives power is generally lower than power conversion efficiency of a wireless power transmitting device that transmits power, and the wireless power transmitting device needs to transmit a sufficient amount of power to compensate for the low power conversion efficiency of the reception device.

Therefore, for example, in a case where the configuration of the phased array system described in Patent Literature 1 mentioned above is applied to a wireless power transmitting device, a sufficient number of transmission circuits for transmitting the above-described power are required. In such a configuration, the transmission circuits are densely arranged. In addition, in the configuration of the phased array system described in Patent Literature 1, the frequency of the output signal of the local oscillator as the signal source and the frequency of the output signal of the phase shifter are the same.

Therefore, in the wireless power transmitting device, the output signal of the signal source sneaks to the path of the output signal of the phase shifter and interferes with the output signal of the phase shifter, so that the phase of the output signal of the phase shifter deviates from the target phase. Besides, in the wireless power transmitting device, the output signal of the phase shifter sneaks to the path of the output signal of the signal source and interferes with the output signal of the signal source, so that the phase of the output signal of the signal source deviates from the target phase. As a result, there is a problem that the phase of the transmission signal transmitted from the antenna deviates from the target phase, and the power of the beam formed by the interference between the transmission signals is attenuated.

In order to explain the present disclosure in more detail, some embodiments for carrying out the present disclosure will be described below with reference to the accompanying drawings.

First Embodiment

FIG. 1 is a block diagram showing a configuration of a wireless power transmitting device 10 according to a first embodiment. The wireless power transmitting device 10 includes a plurality of transmission circuits and a plurality of antennas. Each of the plurality of transmission circuits generates a transmission signal. Each of the plurality of antennas outputs a transmission signal generated by a corresponding one of the plurality of transmission circuits.

As illustrated in FIG. 1, in the first embodiment, the plurality of transmission circuits includes a first transmission circuit 1, a second transmission circuit 2, and a third transmission circuit 3. The plurality of antennas includes a first antenna 4, a second antenna 5, and a third antenna 6. Although an example in which the wireless power transmitting device 10 includes three transmission circuits will be described below, it suffices that the wireless power transmitting device 10 includes at least two or more transmission circuits. In the present specification, the description of "second" and the description of "third" are interchangeable.

Note that $f_{RF}$ in FIG. 1 is a frequency of a transmission signal output from each of a first multiplier 13, a second multiplier 23, and a third multiplier 33 described later. Further, $\theta_1$ in FIG. 1 is a phase of a first transmission signal output from the first multiplier 13 described later. Further, $\theta_2$ in FIG. 1 is a phase of a second transmission signal output from the second multiplier 23 described later. $\theta_3$ in FIG. 1 is a phase of a third transmission signal output from the third multiplier 33 described later. Further, $M_1$ in FIG. 1 is a multiplication number of each of the first multiplier 13, the second multiplier 23, and the third multiplier 33 described later. Note that the multiplication number in the present specification means, for example, the number of N in a case where the multiplier multiplies the frequency of a signal by N. Further, the frequency division number in the present specification means, for example, the number of N in a case where the frequency divider divides the frequency of a signal by N. In addition, the terms "the identical" and "the same" in the present specification mean completely the same, substantially the same, or nearly the same.

An output terminal of the first transmission circuit 1 is connected to an input terminal of the first antenna 4. The first transmission circuit 1 generates a first transmission signal to be radiated into space by the first antenna 4.

An output terminal of the second transmission circuit 2 is connected to an input terminal of the second antenna 5. The second transmission circuit 2 generates a second transmission signal to be radiated into space by the second antenna 5.

An output terminal of the third transmission circuit 3 is connected to an input terminal of the third antenna 6. The third transmission circuit 3 generates a third transmission signal to be radiated into space by the third antenna 6.

The input terminal of the first antenna 4 is connected to an output terminal of the first multiplier 13. The first antenna 4 radiates the first transmission signal generated by the first transmission circuit 1 into space.

The input terminal of the second antenna 5 is connected to an output terminal of the second multiplier 23. The second antenna 5 radiates the second transmission signal generated by the second transmission circuit 2 into space.

The input terminal of the third antenna 6 is connected to an output terminal of the third multiplier 33. The third antenna 6 radiates the third transmission signal generated by the third transmission circuit 3 into space.

Examples of each of the first antenna 4, the second antenna 5, and the third antenna 6 include a dipole antenna, a patch antenna, or the like. Alternatively, for example, the first antenna 4, the second antenna 5, and the third antenna 6 are array antennas obtained by combining a plurality of element antennas. Although the example has been described above, the first antenna 4, the second antenna 5, and the third antenna 6 are not limited to the above example, and it suffices that each of them has at least a function of radiating a transmission signal output from a corresponding one of the first multiplier 13, the second multiplier 23, and the third multiplier 33 into space.

Hereinafter, each configuration of the first transmission circuit 1, the second transmission circuit 2, and the third transmission circuit 3 will be described in more detail. The first transmission circuit 1 includes a first control circuit 11, a first F-PLL 12, and a first multiplier 13 that is a first frequency conversion circuit. In the present specification, F-PLL is a fractional N-type phase synchronization circuit and is an abbreviation for Fractional-N Phase Locked Loop.

Furthermore, in the first embodiment, a configuration in which the first multiplier 13 is used as the first frequency conversion circuit included in the first transmission circuit 1 will be described, but the first frequency conversion circuit included in the first transmission circuit 1 may be a frequency divider.

An output terminal of the first control circuit 11 is connected to a control terminal of the first F-PLL 12. The first control circuit 11 outputs a first control signal A1 for setting the frequency and phase of the first F-PLL signal generated by the first F-PLL 12. In other words, the first control circuit 11 outputs the first control signal A1 being the digital signal that controls the first F-PLL 12 to the first F-PLL 12 so that the first F-PLL 12 generates the first F-PLL signal having the target frequency and the target phase. In the first embodiment, the frequency and the phase of the first F-PLL signal set by the first control signal A1 are $f_{RF}/M_1$ and $\theta_1/M_1$, respectively.

The first control circuit 11 is, for example, an arithmetic circuit (also referred to as a logic circuit or a digital circuit) such as a field programmable gate array (FPGA). Although the example of the first control circuit 11 has been described above, the first control circuit 11 is not limited to the above example, and it suffices that the first control circuit 11 has at least a function of outputting the first control signal A1 for setting the frequency and phase of the first F-PLL signal generated by the first F-PLL 12. Although not illustrated in FIG. 1, the first control circuit 11 may output the first control signal A1 in synchronization with a reference signal input from the outside.

The first F-PLL 12 has the control terminal connected to the output terminal of the first control circuit 11, and an output terminal connected to an input terminal of the first multiplier 13. The first F-PLL 12 generates the first F-PLL signal having the frequency and phase set by the first control signal A1 output from the first control circuit 11. More specifically, in the first embodiment, the first F-PLL 12 performs generation of the first F-PLL signal that is a radio frequency signal and performs phase control of the signal in accordance with the first control signal A1 from the first control circuit 11 in synchronization with the input reference signal. More specifically, in the first embodiment, the first F-PLL 12 outputs the first F-PLL signal having the frequency $f_{RF}/M_1$ and the phase $\theta_1/M_1$ to the first multiplier 13 in accordance with the first control signal A1 output from the first control circuit 11 in synchronization with the input reference signal. Note that the reference signal here is, for example, a clock signal having a frequency $f_{RF}$.

The first F-PLL 12 includes, for example, a phase frequency detector (PFD), a loop filter (LF), a voltage controlled oscillator (VCO), and a variable frequency divider. Although the example of the first F-PLL 12 has been described above, the first F-PLL 12 is not limited to the above example, and it suffices that the first F-PLL 12 has at least a function of generating the first F-PLL signal having the frequency and phase set by the control signal A1 output from the first control circuit 11. Although not illustrated in FIG. 1, the reference signal used by the first F-PLL 12 may be input to the first F-PLL 12 from the outside of the wireless power transmitting device 10, or may be input to the first F-PLL 12 from the first control circuit 11. Alternatively, the first F-PLL 12 may include a reference signal source therein.

The first multiplier 13, which is a first frequency conversion circuit, has an input terminal connected to the output terminal of the first F-PLL 12 and an output terminal connected to the input terminal of the first antenna 4. The first multiplier 13, which is a first frequency conversion circuit, generates a first transmission signal by converting the frequency of the first F-PLL signal generated by the first F-PLL 12. More specifically, in the first embodiment, the first multiplier 13 generates the first transmission signal by multiplying the frequency of the first F-PLL signal generated by the first F-PLL 12. More specifically, in the first embodiment, the first multiplier 13 generates the first transmission signal having the frequency $f_{RF}$ by multiplying the frequency of the first F-PLL signal having the frequency $f_{R}F/M_1$ generated by the first F-PLL 12 by $M_1$. Accordingly, since the phase $\theta_1/M_1$ of the first F-PLL signal is multiplied by $M_1$, the phase of the first transmission signal generated by the first multiplier 13 is $\theta_1$.

The first multiplier 13 is, for example, a PLL, a mixer, or the like. In a case where the first multiplier 13 is a mixer, the first F-PLL signal generated by the first F-PLL 12 is input to an intermediate frequency (IF) terminal and a local oscillator (LO) of the mixer. Alternatively, for example, the configuration of the first multiplier 13 may be a configuration including a transistor and a filter, in which the transistor performs saturation operation, and the filter passes harmonic components of the input signal to generate the first transmission signal. The multiplication number of the first multiplier 13 may be fixed or variable.

Although the example in which the first frequency conversion circuit is the first multiplier 13 has been described above, the first frequency conversion circuit is not limited to the above example, and it suffices that the first frequency conversion circuit has at least a function of generating the first transmission signal by converting the frequency of the first F-PLL signal generated by the first F-PLL 12. That is, the first frequency conversion circuit may be a frequency divider that generates the first transmission signal by dividing the frequency of the first F-PLL signal generated by the first F-PLL 12.

The first antenna 4 outputs the first transmission signal generated by the first multiplier 13 that is the first frequency conversion circuit. More specifically, the first antenna 4 radiates the first transmission signal generated by the first multiplier 13 into space.

The second transmission circuit 2 includes a second control circuit 21, a second F-PLL 22, and a second multiplier 23 that is a second frequency conversion circuit.

In the first embodiment, the configuration in which the second multiplier 23 is used as the second frequency conversion circuit included in the second transmission circuit 2 will be described, but the second frequency conversion circuit included in the second transmission circuit 2 may be a frequency divider.

An output terminal of the second control circuit 21 is connected to a control terminal of the second F-PLL 22. The second control circuit 21 outputs a second control signal A2 for setting the frequency and phase of the second F-PLL signal generated by the second F-PLL 22. In other words, the second control circuit 21 outputs the second control signal A2 being the digital signal that controls the second F-PLL 22 to the second F-PLL 22 so that the second F-PLL 22 generates the second F-PLL signal having the target frequency and the target phase. In the first embodiment, the frequency and phase of the second F-PLL signal set by the second control signal A2 are $f_{RF}/M_1$ and $\theta_2/M_1$, respectively.

The second control circuit 21 is, for example, an arithmetic circuit (also referred to as a logic circuit or a digital circuit) such as a field programmable gate array (FPGA). Although the example of the second control circuit 21 has been described above, the second control circuit 21 is not limited to the above example, and it suffices that the second control circuit 21 has at least a function of outputting the second control signal A2 for setting the frequency and phase of the second F-PLL signal generated by the second F-PLL 22. Although not illustrated in FIG. 1, the second control circuit 21 may output the second control signal A2 in synchronization with a reference signal input from the outside.

The second F-PLL 22 has the control terminal connected to the output terminal of the second control circuit 21, and an output terminal connected to an input terminal of the second multiplier 23. The second F-PLL 22 generates a second F-PLL signal having the frequency and phase set by the second control signal A2 output from the second control circuit 21. More specifically, in the first embodiment, the second F-PLL 22 performs generation of the second F-PLL signal that is a radio frequency signal and performs phase control of the signal in accordance with the second control signal A2 from the second control circuit 21 in synchronization with an input reference signal (not illustrated). More specifically, in the first embodiment, the second F-PLL 22 outputs the second F-PLL signal having the frequency $f_{RF}/M_1$ and the phase $\theta_2/M_1$ to the second multiplier 23 in accordance with the second control signal A2 output from the second control circuit 21 in synchronization with the input reference signal. Note that the reference signal here is, for example, a clock signal having a frequency $f_{RF}$.

The second F-PLL 22 includes, for example, a phase frequency detector (PFD), a loop filter (LF), a voltage controlled oscillator (VCO), and a variable frequency divider. Although the example of the second F-PLL 22 has been described above, the second F-PLL 22 is not limited to the above example, and it suffices that the second F-PLL 22 has at least a function of generating the second F-PLL signal having the frequency and phase set by the second control signal A2 output from the second control circuit 21. Although not illustrated in FIG. 1, the reference signal used by the second F-PLL 22 may be input to the second F-PLL 22 from the outside of the wireless power transmitting device 10, or may be input to the second F-PLL 22 from the second control circuit 21. Alternatively, the second F-PLL 22 may include a reference signal source therein.

The second multiplier 23, which is a second frequency conversion circuit, has an input terminal connected to the output terminal of the second F-PLL 22 and an output terminal connected to the input terminal of the second antenna 5. The second multiplier 23, which is a second frequency conversion circuit, generates a second transmission signal by converting the frequency of the second F-PLL signal generated by the second F-PLL 22. More specifically, in the first embodiment, the second multiplier 23 generates the second transmission signal by multiplying the frequency of the second F-PLL signal generated by the second F-PLL 22. More specifically, in the first embodiment, the second multiplier 23 generates the second transmission signal having the frequency $f_{RF}$ by multiplying the frequency of the second F-PLL signal having the frequency $f_{RF}/M_1$ generated by the second F-PLL 22 by $M_1$. Accordingly, since the phase $\theta_2/M_1$ of the second F-PLL signal is multiplied by $M_1$, the phase of the second transmission signal generated by the second multiplier 23 is $\theta_2$.

The second multiplier 23 is, for example, a PLL, a mixer, or the like. In a case where the second multiplier 23 is a mixer, the second F-PLL signal generated by the second F-PLL 22 is input to an intermediate frequency (IF) terminal and a local oscillator (LO) of the mixer. Alternatively, for example, the configuration of the second multiplier 23 may be a configuration including a transistor and a filter, in which the transistor performs saturation operation, and the filter passes harmonic components of the input signal to generate the second transmission signal. The multiplication number of the second multiplier 23 may be fixed or variable. Although the example in which the second frequency conversion circuit is the second multiplier 23 has been described above, the second frequency conversion circuit is not limited to the above example, and it suffices that the second frequency conversion circuit has at least a function of generating the second transmission signal by converting the frequency of the second F-PLL signal generated by the second F-PLL 22. That is, the second frequency conversion circuit may be a frequency divider that generates the second transmission signal by dividing the frequency of the second F-PLL signal generated by the second F-PLL 22.

The second antenna 5 outputs the second transmission signal generated by the second multiplier 23 that is a second frequency conversion circuit. More specifically, the second antenna 5 radiates the second transmission signal generated by the second multiplier 23 into space.

The third transmission circuit 3 includes a third control circuit 31, a third F-PLL 32, and a third multiplier 33 that is a third frequency conversion circuit.

Note that, in the first embodiment, a configuration in which the third multiplier 33 is used as the third frequency conversion circuit included in the third transmission circuit 3 will be described, but the third frequency conversion circuit included in the third transmission circuit 3 may be a frequency divider.

An output terminal of the third control circuit 31 is connected to a control terminal of the third F-PLL 32. The third control circuit 31 outputs a third control signal A3 for setting the frequency and phase of a third F-PLL signal generated by the third F-PLL 32. In other words, the third control circuit 31 outputs the third control signal A3 being the digital signal that controls the third F-PLL 32 to the third F-PLL 32 so that the third F-PLL 32 generates the third F-PLL signal having the target frequency and the target phase. In the first embodiment, the frequency and phase of the third F-PLL signal set by the third control signal A3 are $f_{RF}/M_1$ and $\theta_3/M_1$, respectively.

The third control circuit 31 is, for example, an arithmetic circuit (also referred to as a logic circuit or a digital circuit) such as a field programmable gate array (FPGA). Although the example of the third control circuit 31 has been described above, the third control circuit 31 is not limited to the above example, and it suffices that the third control circuit 31 has at least a function of outputting the third control signal A3 for setting the frequency and phase of the third F-PLL signal generated by the third F-PLL 32. Although not illustrated in FIG. 1, the third control circuit 31 may output the third control signal A3 in synchronization with a reference signal input from the outside.

The third F-PLL 32 has the control terminal connected to the output terminal of the third control circuit 31 and an output terminal connected to the input terminal of the third multiplier 33. The third F-PLL 32 generates a third F-PLL signal having a frequency and a phase set by the third control signal A3 output from the third control circuit 31. More specifically, in the first embodiment, the third F-PLL 32 performs generation of the third F-PLL signal that is a radio frequency signal and performs phase control of the signal in accordance with the third control signal A3 from the third control circuit 31 in synchronization with an input reference signal (not illustrated). More specifically, in the first embodiment, the third F-PLL 32 outputs the third F-PLL signal having the frequency $f_{RF}/M_1$ and the phase $\theta_3/M_1$ to the third multiplier 33 in accordance with the third control signal A3 output from the third control circuit 31 in synchronization with the input reference signal. Note that the reference signal here is, for example, a clock signal having a frequency $f_{RF}$.

The third F-PLL 32 includes, for example, a phase frequency detector (PFD), a loop filter (LF), a voltage controlled oscillator (VCO), and a variable frequency divider. Although the example of the third F-PLL 32 has been described above, the third F-PLL 32 is not limited to the above example, and it suffices that the third F-PLL 32 has at least a function of generating the third F-PLL signal having the frequency and phase set by the third control signal A3 output from the third control circuit 31. Although not illustrated in FIG. 1, the reference signal used by the third F-PLL 32 may be input to the third F-PLL 32 from the outside of the wireless power transmitting device 10, or may be input to the third F-PLL 32 from the third control circuit 31. Alternatively, the third F-PLL 32 may include a reference signal source therein.

The third multiplier 33, which is the third frequency conversion circuit, has an input terminal connected to the output terminal of the third F-PLL 32 and an output terminal connected to the input terminal of the third antenna 6. The third multiplier 33, which is the third frequency conversion circuit, generates a third transmission signal by converting the frequency of the third F-PLL signal generated by the third F-PLL 32. More specifically, in the first embodiment, the third multiplier 33 generates the third transmission signal by multiplying the frequency of the third F-PLL signal generated by the third F-PLL 32. More specifically, in the first embodiment, the third multiplier 33 generates the third transmission signal having the frequency $f_RF$ by multiplying the frequency of the third F-PLL signal having the frequency $f_{RF}/M_1$ generated by the third F-PLL 32 by $M_1$. Accordingly, since the phase $\theta_3/M_1$ of the third F-PLL signal is multiplied by $M_1$, the phase of the third transmission signal generated by the third multiplier 33 is $\theta_3$.

The third multiplier 33 is, for example, a PLL, a mixer, or the like. In a case where the third multiplier 33 is a mixer, the third F-PLL signal generated by the third F-PLL 32 is input to an intermediate frequency (IF) terminal and a local oscillator (LO) of the mixer. Alternatively, for example, the configuration of the third multiplier 33 may be a configuration including a transistor and a filter, in which the transistor performs saturation operation, and the filter passes harmonic components of the input signal to generate the third transmission signal. The multiplication number of the third multiplier 33 may be fixed or variable. Although the example in which the third frequency conversion circuit is the third multiplier 33 has been described above, the third frequency conversion circuit is not limited to the above example, and it suffices that the third frequency conversion circuit has at least a function of generating the third transmission signal by converting the frequency of the third F-PLL signal generated by the third F-PLL 32. That is, the third frequency conversion circuit may be a frequency divider that generates the third transmission signal by dividing the frequency of the third F-PLL signal generated by the third F-PLL 32.

The third antenna 6 outputs the third transmission signal generated by the third multiplier 33 that is the third frequency conversion circuit. More specifically, the third antenna 6 radiates the third transmission signal generated by the third multiplier 33 into space.

As described above, in the first embodiment, the frequency of the first F-PLL signal generated by the first F-PLL 12, the frequency of the second F-PLL signal generated by the second F-PLL 22, and the frequency of the third F-PLL signal generated by the third F-PLL 32 are the same ($f_{RF}/M_1$).

In the first embodiment, the first multiplier 13 that is the first frequency conversion circuit, the second multiplier 23 that is the second frequency conversion circuit, and the third multiplier 33 that is the third frequency conversion circuit have the same multiplication number ($M_1$). Unlike the first embodiment, in a case where the first frequency conversion circuit, the second frequency conversion circuit, and the third frequency conversion circuit are frequency dividers, the first frequency divider included in the first transmission circuit 1, the second frequency divider included in the second transmission circuit 2, and the third frequency divider included in the third transmission circuit 3 have the same frequency division number. In other words, in a case where the wireless power transmitting device 10 includes the first frequency divider, the second frequency divider, and the third frequency divider instead of the first multiplier 13, the second multiplier 23, and the third multiplier 33, the frequency division number of the first frequency divider, the frequency division number of the second frequency divider, and the frequency division number of the third frequency divider are the same. In addition, in a case where a frequency divider that divides by $N_1$ is used as the first frequency divider, the second frequency divider, and the third frequency divider, the frequency of the transmission signal generated by the frequency divider is a value of $1/N_1$ of the frequency of the F-PLL signal, and the phase is also a value of $1/N_1$ of the frequency of the F-PLL signal. Therefore, when the frequency of the target transmission signal is $f_{RF}$ and the phase of the target transmission signal is $\theta_1$, the frequency of the F-PLL signal is $N_1 \cdot f_{RF}$ and the phase is $N_1 \cdot \theta_1$.

In the first embodiment, the frequency of the first transmission signal generated by the first frequency conversion circuit and output from the first antenna 4, the frequency of the second transmission signal generated by the second frequency conversion circuit and output from the second antenna 5, and the frequency of the third transmission signal generated by the third frequency conversion circuit and output from the third antenna 6 are the same ($f_{RF}$).

Although not illustrated in FIG. 1, the reference signals input to the first F-PLL 12, the second F-PLL 22, and the third F-PLL 32 may be the same signal or different signals. That is, the phases of the reference signals input to the first F-PLL 12, the second F-PLL 22, and the third F-PLL 32 may be the same or different. The frequencies of the reference signals input to the first F-PLL 12, the second F-PLL 22, and the third F-PLL 32 may be the same or different.

Hereinafter, a detailed configuration of the first F-PLL 12 will be described with reference to the drawings. Note that the second F-PLL 22 and the third F-PLL 32 each have a configuration similar to the configuration of the first F-PLL 12 described below.

Figure 2:
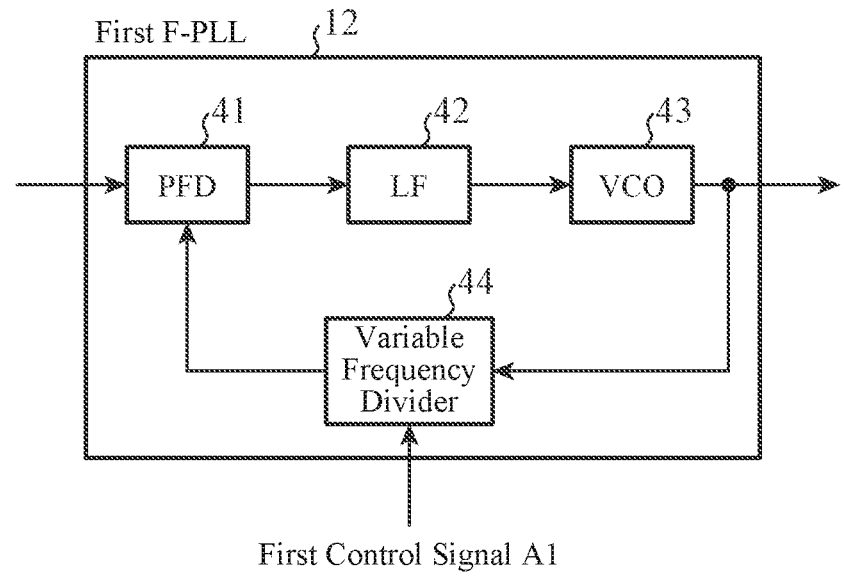
FIG. 2 is a block diagram showing a configuration of a first F-PLL according to the first embodiment.

FIG. 2 is a block diagram showing a configuration of the first F-PLL 12. In FIG. 2, it is assumed that the reference signal is input from the outside.

As illustrated in FIG. 2, the first F-PLL 12 includes a PFD 41 that is a phase frequency detector, an LF 42 that is a loop filter, a VCO 43 that is a voltage controlled oscillator, and a variable frequency divider 44. The PFD 41 generates a PFD signal on the basis of the reference signal. The LF 42 generates an LF signal on the basis of the PFD signal. The VCO 43 generates an oscillation signal on the basis of the LF signal. The variable frequency divider 44 generates a frequency-divided signal on the basis of the oscillation signal.

More specifically, the PFD 41 has a reference signal input terminal connected to an output terminal of a reference signal source (not illustrated) provided outside the first F-PLL 12, a comparison signal input terminal connected to an output terminal of the variable frequency divider 44, and an output terminal connected to an input terminal of the LF 42. The PFD 41 compares the phase of the reference signal with the phase of the frequency-divided signal generated by the variable frequency divider 44, and generates a PFD signal corresponding to the phase difference between the reference signal and the frequency-divided signal. In other words, the PFD 41 compares the phase of the reference signal input from the outside with the phase of the frequency-divided signal output from the variable frequency divider 44 and outputs the PFD signal in accordance with the phase difference to the LF 42. Examples of the PFD 41 include a mixer, a logic circuit using exclusive OR, and the like.

The LF 42 has an input terminal connected to an output terminal of the PFD 41 and an output terminal connected to an input terminal of the VCO 43. The LF 42 generates an LF signal having a control voltage for the VCO 43 by smoothing the PFD signal generated by the PFD 41. The LF 42 outputs the generated LF signal to the VCO 43. Examples of the LF 42 include a low pass filter (LPF) including a capacitance, a resistance, and the like. Alternatively, for example, the LF 42 is a filter incorporating an operational amplifier in accordance with a required gain.

The VCO 43 has an input terminal connected to the output terminal of the LF 42 and an output terminal connected to the input terminal of the variable frequency divider 44. The VCO 43 generates an oscillation signal as the above-described first F-PLL signal by controlling the oscillation frequency on the basis of the control voltage of the LF signal generated by the LF 42. The VCO 43 outputs the generated oscillation signal to the variable frequency divider 44. In addition, the VCO 43 outputs the generated oscillation signal to the first multiplier 13 as a first F-PLL signal. Examples of the VCO 43 include an oscillator whose oscillation frequency is changed by a variable capacitance diode, a voltage controlled crystal oscillator, or the like. Note that the variable capacitance diode changes its capacitance depending on the voltage applied to it. As a result, the resonance frequency of a resonance circuit including the variable capacitance diode changes, and the oscillation frequency changes. Although the example of the VCO 43 has been described above, the VCO 43 is not limited to the above example, and it suffices that the VCO 43 has at least a function of generating an oscillation signal as the above-described first F-PLL signal by controlling the oscillation frequency on the basis of the control voltage of the LF signal generated by the LF 42.

The variable frequency divider 44 has an input terminal connected to an output terminal of the VCO 43, a control terminal connected to the output terminal of the first control circuit 11, and an output terminal connected to the comparison signal input terminal of the PFD 41. The variable frequency divider 44 generates a frequency-divided signal by frequency-dividing the oscillation signal generated by the VCO 43 on the basis of the first control signal A1 output from the first control circuit 11. In other words, the variable frequency divider 44 divides the frequency of the oscillation signal input from the VCO 43 in accordance with the first control signal A1 input from the first control circuit 11 and outputs a frequency-divided signal, which is the signal obtained by the frequency division, to the PFD 41. The variable frequency divider 44 is, for example, an FPGA. However, the variable frequency divider 44 is not limited to the above example, and it suffices that the variable frequency divider 44 has at least a function of generating a frequency-divided signal by frequency-dividing the oscillation signal generated by the VCO 43 on the basis of the first control signal A1 output from the first control circuit 11. In the first embodiment, the first control signal A1 sets the frequency and phase of the first F-PLL signal by setting the frequency division number of the variable frequency divider 44.

Hereinafter, an operation of the wireless power transmitting device 10 according to the first embodiment will be described. In the description of the operation, it is assumed that the wireless power transmitting device 10 includes the first F-PLL 12 illustrated in FIG. 2, and the second F-PLL 22 and the third F-PLL 32 each having a configuration similar to the configuration of the first F-PLL 12 illustrated in FIG. 2. In addition, it is assumed that the above-described reference signal is input to each of the first F-PLL 12, the second F-PLL 22, and the third F-PLL 32 from the outside of the wireless power transmitting device 10. In the description of the operation, it is assumed that $\theta_1$ that is the phase of the first transmission signal output from the first multiplier 13 and $\theta_2$ that is the phase of the second transmission signal output from the second multiplier 23 satisfy the relational expression of $\theta_2=\theta_1-\pi/2$, and $\theta_1$ that is the phase of the first transmission signal output from the first multiplier 13 and $\theta_3$ that is the phase of the third transmission signal output from the third multiplier 33 satisfy the relational expression of $\theta_3=\theta_1\pm 2k\pi$. Note that k is a positive integer.

First, the first control circuit 11 outputs, to the first F-PLL 12, the first control signal A1 for setting the frequency of the first F-PLL signal generated by the first F-PLL 12 to $f_{RF}/M_1$ and for setting the phase of the first F-PLL signal to $\theta_1/M_1$.

Next, the first F-PLL 12 generates a first F-PLL signal having a frequency $f_{RF}/M_1$ and a phase $\theta_1/M_1$ set by the first control signal A1 output from the first control circuit 11. The first F-PLL 12 outputs the generated first F-PLL signal to the first multiplier 13.

Next, the first multiplier 13 generates a first transmission signal having a frequency $f_{RF}$ and a phase $\theta_1$ by multiplying the frequency of the first F-PLL signal generated by the first F-PLL 12 by $M_1$. The first multiplier 13 outputs the generated first transmission signal to the first antenna 4.

Next, the first antenna 4 radiates the first transmission signal generated by the first multiplier 13 into space.

On the other hand, the second control circuit 21 outputs, to the second F-PLL 22, the second control signal A2 for setting the frequency of the second F-PLL signal generated by the second F-PLL 22 to $f_{RF}/M_1$ and for setting the phase of the second F-PLL signal to $(\theta_1-\pi/2)/M_1$.

Next, the second F-PLL 22 generates a second F-PLL signal having a frequency $f_{RF}/M_1$ and a phase $(\theta_1-\pi/2)/M_1$ set by the second control signal A2 output from the second control circuit 21. The second F-PLL 22 outputs the generated second F-PLL signal to the second multiplier 23.

Next, the second multiplier 23 generates a second transmission signal having a frequency $f_{RF}$ and a phase $(\theta_1-\pi/2)$ by multiplying the frequency of the second F-PLL signal generated by the second F-PLL 22 by $M_1$. The second multiplier 23 outputs the generated second transmission signal to the second antenna 5.

Next, the second antenna 5 radiates the second transmission signal generated by the second multiplier 23 into space.

On the other hand, the third control circuit 31 outputs, to the third F-PLL 32, the third control signal A3 for setting the frequency of the third F-PLL signal generated by the third F-PLL 32 to $f_{RF}/M_1$, and the phase of the third F-PLL signal to $(\theta_1\pm 2k\pi)/M_1$.

Next, the third F-PLL 32 generates a third F-PLL signal having a frequency $f_{RF}/M_1$ and a phase $(\theta_1\pm 2k\pi)/M_1$ set by the third control signal A3 output from the third control circuit 31. The third F-PLL 32 outputs the generated third F-PLL signal to the third multiplier 33.

Next, the third multiplier 33 generates a third transmission signal having a frequency $f_{RF}$ and a phase $(\theta_1+2k\pi)$ by multiplying the frequency of the third F-PLL signal generated by the third F-PLL 32 by $M_1$. The third multiplier 33 outputs the generated third transmission signal to the third antenna 6.

Next, the third antenna 6 radiates the third transmission signal generated by the third multiplier 33 into space.

Hereinafter, specific examples of the first control signal A1 output from the first control circuit 11 and the second control signal A2 output from the second control circuit 21 will be described with reference to the drawings. As described above, the phase of the first F-PLL signal set by the first control signal A1 is $\theta_1/M_1$, and the phase of the second F-PLL signal set by the second control signal A2 is $(\theta_1-\pi/2)/M_1$. In addition, in order to simplify the description, it is assumed that the average value of the frequency division numbers of the variable frequency dividers included in the first F-PLL 12 and the second F-PLL 22 is 10.25.

Figure 3:
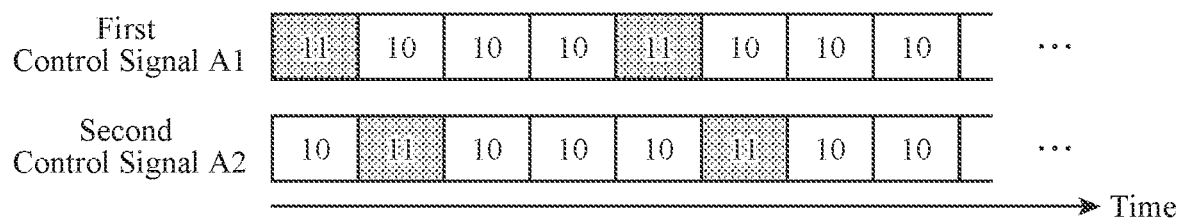
FIG. 3 is a diagram illustrating a setting pattern of a frequency division number of a variable frequency divider in the first F-PLL, which is set by a first control signal according to a specific example of the first embodiment, and a setting pattern of a frequency division number of a variable frequency divider in a second F-PLL, which is set by a second control signal.

As described above, each of the first control signal A1, the second control signal A2, and the third control signal A3 sets the frequency and the phase of the F-PLL signal by setting the frequency division number of the variable frequency divider in the corresponding F-PLL. FIG. 3 is a diagram illustrating a setting pattern of the frequency division number of the variable frequency divider 44 in the first F-PLL 12 set by the first control signal A1 and a setting pattern of the frequency division number of the variable frequency divider (not illustrated) in the second F-PLL 22 set by the second control signal A2 according to this specific example. A method of controlling the phase of the output signal of the F-PLL by changing the setting pattern of the frequency division number of the variable frequency divider in the F-PLL is described in, for example, Non-Patent Literature, K. Tajima, et al., "Frequency and Phase Difference Control Using Fractional-N PLL Synthesizers by Composition of Control Data", IEEE Transaction on Microwave Theory and Techniques, vol. 55, no. 12, December, 2007. In this Non-Patent Literature, a variable frequency divider in an F-PLL implements fractional frequency division by synchronizing with a reference signal and switching integer frequency division at a high speed at a speed of the reference signal. In this specific example, similarly, the variable frequency divider 44 in the first F-PLL 12 and the variable frequency divider in the second F-PLL 22 are synchronized with the reference signal, and the integer frequency division is switched at the speed of the reference signal.

As illustrated in FIG. 3, the setting pattern of the frequency division number of the variable frequency divider 44 in the first F-PLL 12 set by the first control signal A1 is a pattern in which 11, 10, 10, and 10 are repeated, and the frequency division numbers of the average value 10.25 are implemented in the variable frequency divider 44 of the first F-PLL 12. The setting pattern of the frequency division number of the variable frequency divider in the second F-PLL 22 set by the second control signal A2 is a pattern in which 10, 11, 10, and 10 are repeated, and the frequency division numbers of the average value 10.25 are implemented in the variable frequency divider of the second F-PLL 22. That is, the average value of the frequency division numbers of the variable frequency divider 44 in the first F-PLL 12 set by the first control signal A1 is the same as the average value of the frequency division numbers of the variable frequency divider in the second F-PLL 22 set by the second control signal A2.

As described above, since the average value of the frequency division numbers of the variable frequency divider 44 in the first F-PLL 12 is the same as the average value of the frequency division numbers of the variable frequency divider in the second F-PLL 22, the frequency of the resultant first F-PLL signal and the frequency of the resultant second F-PLL signal are the same. However, since the first control signal A1 and the second control signal A2 have different setting patterns, the phase of the resultant first F-PLL signal and the phase of the resultant second F-PLL signal are different.

More specifically, since the second control signal A2 is delayed from the first control signal A1 by ¼ of one cycle of the pattern, the operation of the variable frequency divider of the second F-PLL 22 is also delayed from the operation of the variable frequency divider 44 of the first F-PLL 12 by ¼ of the one cycle. Therefore, the phase of the second F-PLL signal resultantly output from the second F-PLL 22 is delayed by $2\pi/4=\pi/2$ from the phase of the first F-PLL signal resultantly output from the first F-PLL 12. As a result, $\theta_2=\theta_1-\pi/2$ is implemented.

Hereinafter, a first modification of the first embodiment will be described. In the first modification, the phase of the first transmission signal generated by the first multiplier 13 and output from the first antenna 4 is the same as the phase of the third transmission signal generated by the third multiplier 33 that is a third frequency conversion circuit and output from the third antenna 6. On the other hand, the phase of the first F-PLL signal generated by the first F-PLL 12 of the first transmission circuit 1 is different from the phase of the third F-PLL signal generated by the third F-PLL 32 of the third transmission circuit 3.

As described above, when the phase of the first transmission signal generated by the first multiplier 13 that is a first frequency conversion circuit and output from the first antenna 4 is $\theta_1$, the phase of the third transmission signal generated by the third multiplier 33 that is the third frequency conversion circuit and output by the third antenna 6 is $\theta_1+2k\pi$ (k is an integer equal to or more than 1). That is, the phase of the first transmission signal generated by the first multiplier 13 and output from the first antenna 4 can be regarded as the same as the phase of the third transmission signal generated by the third multiplier 33 that is the third frequency conversion circuit and output from the third antenna 6. On the other hand, in the first modification, the phase of the first F-PLL signal generated by the first F-PLL 12 is different from the phase of the third F-PLL signal generated by the third F-PLL 32.

More specifically, in the first modification, it is assumed that each of the multiplication numbers $M_1$ of the first multiplier 13, the second multiplier 23, and the third multiplier 33 satisfies $M_1=2$. Further, it is assumed that $\theta_1$ which is the phase of the first transmission signal output from the first multiplier 13 is 30 degrees. In addition, the above-described relational expression $\theta_3=\theta_1\pm 2k\pi$ between $\theta_1$ and $\theta_3$, which is the phase of the third transmission signal output from the third multiplier 33, is converted into an angle and is $\theta_3=\theta_1+360$ k. Here, k satisfies k=1, and $\theta_3=30+360=390$ degrees. In this case, since the phase of the first F-PLL signal output from the first F-PLL 12 is $\theta_1/M_1$, the phase is 15 degrees. On the other hand, since the phase of the third F-PLL signal output from the third F-PLL 32 is $(\theta_1+360 \text{ k})/M_1$, the phase is 195 degrees.

In wireless power transmission, the transmission signal is a sine wave, and can be treated as the same phase regardless of whether the phase is 30 degrees or 390 degrees. Therefore, the phase of the first transmission signal and the phase of the third transmission signal are the same, but the phase of the first F-PLL signal and the phase of the third F-PLL signal are different.

According to the configuration of the first modification, even if the frequency of the first F-PLL signal is the same as the frequency of the third F-PLL signal, the phase of the first F-PLL signal is different from the phase of the third F-PLL signal, so that interference between the first F-PLL signal and the third F-PLL signal can be suppressed.

Hereinafter, a second modification of the first embodiment will be described. In the second modification, the phase of the first F-PLL signal generated by the first F-PLL 12, the phase of the second F-PLL signal generated by the second F-PLL 22, and the phase of the third F-PLL signal generated by the third F-PLL 32 are the same. On the other hand, the first control signal A1 output from the first control circuit 11, the second control signal A2 output from the second control circuit 21, and the third control signal A3 output from the third control circuit 31 are different from each other. More specifically, the setting pattern of the first control signal A1 output from the first control circuit 11, the setting pattern of the second control signal A2 output from the second control circuit 21, and the setting pattern of the third control signal A3 output from the third control circuit 31 are different from each other.

Figure 4:
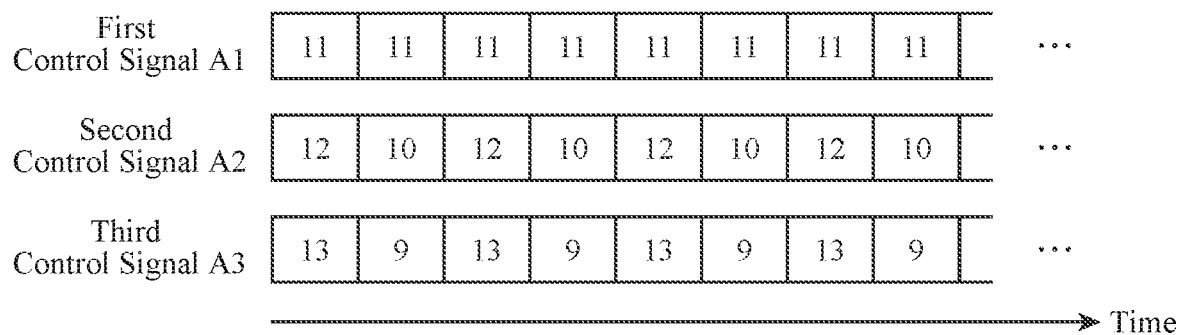
FIG. 4 is a diagram illustrating a setting pattern of the frequency division number of the variable frequency divider in the first F-PLL, which is set by the first control signal according to a second modification of the first embodiment, a setting pattern of the frequency division number of the variable frequency divider in the second F-PLL, which is set by the second control signal, and a setting pattern of a frequency division number of a variable frequency divider in a third F-PLL, which is set by a third control signal.

FIG. 4 is a diagram illustrating a setting pattern of the frequency division number of the variable frequency divider 44 in the first F-PLL 12 set by the first control signal A1 according to the second modification, a setting pattern of the frequency division number of the variable frequency divider (not illustrated) in the second F-PLL 22 set by the second control signal A2, and a setting pattern of the frequency division number of the variable frequency divider (not illustrated) in the third F-PLL 32 set by the third control signal A3. Note that $\theta_1$, $\theta_2$, and $\theta_3$ described above are the same and satisfy $\theta_1=\theta_2=\theta_3$, and the average value of the frequency division numbers of the respective variable frequency dividers in the first F-PLL 12, the second F-PLL 22, and the third F-PLL 32 is 11.0.

As illustrated in FIG. 4, in the setting pattern of the frequency division number of the variable frequency divider 44 in the first F-PLL 12 set by the first control signal A1, the frequency division number is always 11, and the frequency division numbers having the average value 11 are implemented in the variable frequency divider 44 of the first F-PLL 12. The setting pattern of the frequency division number of the variable frequency divider in the second F-PLL 22 set by the second control signal A2 is a pattern in which 12 and 10 are alternately repeated, and the frequency division numbers having the average value 11 are implemented in the variable frequency divider of the second F-PLL 22. The setting pattern of the frequency division number of the variable frequency divider in the third F-PLL 32 set by the third control signal A3 is a pattern in which 13 and 9 are alternately repeated, and the frequency division numbers having the average value 11 are implemented in the variable frequency divider of the third F-PLL 32.

That is, the average value of the frequency division numbers of the variable frequency divider 44 in the first F-PLL 12 set by the first control signal A1, the average value of the frequency division numbers of the variable frequency divider in the second F-PLL 22 set by the second control signal A2, and the average value of the frequency division numbers of the variable frequency divider 44 in the third F-PLL 32 set by the third control signal A3 are the same.

As described above, since the average value of the frequency division numbers of the variable frequency divider 44 in the first F-PLL 12, the average value of the frequency division numbers of the variable frequency divider in the second F-PLL 22, and the average value of the frequency division numbers of the variable frequency divider in the third F-PLL 32 are the same, the frequency of the resultant first F-PLL signal, the frequency of the resultant second F-PLL signal, and the frequency of the resultant third F-PLL signal are the same.

In addition, the setting pattern of the first control signal A1, the setting pattern of the second control signal A2, and the setting pattern of the third control signal A3 illustrated in FIG. 4 are each set so that the phase of the first F-PLL signal resultantly generated by the first F-PLL 12, the phase of the second F-PLL signal resultantly generated by the second F-PLL 22, and the phase of the third F-PLL signal resultantly generated by the third F-PLL 32 are the same.

For example, the wireless power transmitting device 10 may include a measurement circuit (not shown) that measures each of the phase of the first F-PLL signal, the phase of the second F-PLL signal, and the phase of the third F-PLL signal. In such a configuration, the wireless power transmitting device 10 may set the setting pattern of the first control signal A1, the setting pattern of the second control signal A2, and the setting pattern of the third control signal A3 on the basis of the measurement result so that the phase of the first F-PLL signal, the phase of the second F-PLL signal, and the phase of the third F-PLL signal are the same. Alternatively, a measurement circuit (not illustrated) that measures each of the radiation pattern of the first transmission signal output from the first antenna 4, the radiation pattern of the second transmission signal output from the second antenna 5, and the radiation pattern of the third transmission signal output from the third antenna 6 may be installed outside the wireless power transmitting device 10. In such a configuration, the wireless power transmitting device 10 may calculate each of the phase of the first F-PLL signal, the phase of the second F-PLL signal, and the phase of the third F-PLL signal from the radiation pattern, and set each of the setting pattern of the first control signal A1, the setting pattern of the second control signal A2, and the setting pattern of the third control signal A3 on the basis of the calculation result so that the phase of the first F-PLL signal, the phase of the second F-PLL signal, and the phase of the third F-PLL signal are the same.

According to the configuration of the second modification, even if the frequency of the first F-PLL signal, the frequency of the second F-PLL signal, and the frequency of the third F-PLL signal are the same, and the phase of the first F-PLL signal, the phase of the second F-PLL signal, and the phase of the third F-PLL signal are the same, the first control signal A1, the second control signal A2, and the third control signal A3 are different from each other. As a result, interference between the first control signal A1 and the second control signal A2, interference between the second control signal A2 and the third control signal A3, or interference between the first control signal A1 and the third control signal A3 can be suppressed.

As described above, the wireless power transmitting device 10 according to the first embodiment includes: a plurality of transmission circuits each generating a transmission signal; and a plurality of antennas each outputting a transmission signal generated by a corresponding one of the plurality of transmission circuits. Each of the plurality of transmission circuits includes a control circuit, an F-PLL, and a frequency conversion circuit, the control circuit outputs a control signal for setting a frequency and a phase of an F-PLL signal generated by the F-PLL, the F-PLL generates the F-PLL signal having the frequency and the phase set by the control signal output from the control circuit, and the frequency conversion circuit generates the transmission signal by converting a frequency of the F-PLL signal generated by the F-PLL.

According to the above configuration, unlike the configuration using the conventional phase shifter, the F-PLL generates the F-PLL signal having the frequency and phase set by the control signal, and the frequency conversion circuit generates the transmission signal by converting a frequency of the F-PLL signal. As a result, both the frequency and the phase are converted in the F-PLL, and the frequency of the signal (for example, the reference signal) before the phase shift and the frequency of the signal (F-PLL signal) after the phase shift are different. Therefore, it is possible to prevent the signal before the phase shift from sneaking to the path of the signal of the same frequency after the phase shift and interfering with the signal of the same frequency after the phase shift, and, inside the wireless power transmitting device 10, prevent the signal after the phase shift from sneaking to the path of the signal of the same frequency before the phase shift and interfering with the signal of the same frequency before the phase shift. That is, interference between signals of the same frequency in the wireless power transmitting device 10 can be suppressed. Therefore, it is possible to prevent the phase of the transmission signal transmitted by the antenna from deviating from the target phase, and to prevent the power of the beam formed by the interference between the transmission signals from being attenuated or the direction of the beam from changing from the desired direction.

Further, in the wireless power transmitting device 10 according to the first embodiment, the F-PLL includes: the PFD 41 to generate a PFD signal on the basis of a reference signal; the LF 42 to generate an LF signal on the basis of the PFD signal; the VCO 43 to generate an oscillation signal on the basis of the LF signal; and the variable frequency divider 44 to generate a frequency-divided signal on the basis of the oscillation signal, the PFD 41 generates the PFD signal corresponding to a phase difference between the reference signal and the frequency-divided signal by comparing a phase of the reference signal with a phase of the frequency-divided signal generated by the variable frequency divider 44, the LF 42 generates the LF signal having a control voltage for the VCO 43 by smoothing the PFD signal generated by the PFD 41, the VCO 43 generates the oscillation signal as the F-PLL signal by controlling an oscillation frequency on the basis of the control voltage of the LF signal generated by the LF 42, and the variable frequency divider 44 generates the frequency-divided signal by frequency-dividing the oscillation signal generated by the VCO 43 on the basis of the control signal output from the control circuit.

According to the above configuration, the F-PLL can desirably generate the F-PLL signal having the frequency and phase set by the control signal output from the control circuit by the PFD 41, the LF 42, the VCO 43, and the variable frequency divider 44.

In addition, in the wireless power transmitting device 10 according to the first embodiment, the plurality of transmission circuits includes the first transmission circuit 1 and the second transmission circuit 2, the plurality of antennas includes the first antenna 4 connected to the first transmission circuit 1 and the second antenna 5 connected to the second transmission circuit 2, the first transmission circuit 1 includes the first control circuit 11, the first F-PLL 12, and the first multiplier 13 which is the first frequency conversion circuit, the first control circuit 11 outputs the first control signal A1 for setting the frequency and phase of the first F-PLL signal generated by the first F-PLL 12, the first F-PLL 12 generates the first F-PLL signal having the frequency and phase set by the first control signal A1 output from the first control circuit 11, the first frequency conversion circuit generates a first transmission signal by converting the frequency of the first F-PLL signal generated by the first F-PLL 12, the first antenna 4 outputs the first transmission signal generated by the first frequency conversion circuit, the second transmission circuit 2 includes the second control circuit 21, the second F-PLL 22, and the second multiplier 23 that is the second frequency conversion circuit, the second control circuit 21 outputs the second control signal A2 for setting the frequency and phase of the second F-PLL signal generated by the second F-PLL 22, the second F-PLL 22 generates the second F-PLL signal having the frequency and phase set by the second control signal A2 output from the second control circuit 21, the second frequency conversion circuit generates the second transmission signal by converting a frequency of the second F-PLL signal generated by the second F-PLL 22, and the second antenna 5 outputs the second transmission signal generated by the second frequency conversion circuit.

According to the above configuration, unlike the configuration using the conventional phase shifter, the first F-PLL 12 generates the first F-PLL signal having the frequency and phase set by the control signal, and the first frequency conversion circuit generates the first transmission signal by converting the frequency of the first F-PLL signal. Furthermore, according to the above configuration, unlike the configuration using the conventional phase shifter, the second F-PLL 22 generates the second F-PLL signal having the frequency and phase set by the control signal, and the second frequency conversion circuit generates the second transmission signal by converting the frequency of the second F-PLL signal. As a result, it is possible to prevent the signal before the phase shift from sneaking to the path of the signal of the same frequency after the phase shift and interfering with the signal of the same frequency after the phase shift, and prevent the signal after the phase shift from sneaking to the path of the signal of the same frequency before the phase shift and interfering with the signal of the same frequency before the phase shift inside the wireless power transmitting device 10. That is, interference between signals of the same frequency in the wireless power transmitting device 10 can be suppressed.

Further, in the wireless power transmitting device 10 according to the first embodiment, the frequency of the first F-PLL signal generated by the first F-PLL 12 is the same as the frequency of the second F-PLL signal generated by the second F-PLL 22, the first frequency conversion circuit and the second frequency conversion circuit have the same multiplication number or frequency division number, and a frequency of the first transmission signal generated by the first frequency conversion circuit and output from the first antenna 4 is the same as a frequency of the second transmission signal generated by the second frequency conversion circuit and output from the second antenna 5.

According to the above configuration, the first transmission signal output from the first antenna 4 and the second transmission signal output from the second antenna 5 interfere with each other, so that a beam can be formed in a target transmission direction.

In addition, in the wireless power transmitting device 10 according to the first embodiment, the phase of the first transmission signal generated by the first frequency conversion circuit and output from the first antenna 4 is the same as the phase of the third transmission signal generated by the third frequency conversion circuit and output from the third antenna 6, and the phase of the first F-PLL signal generated by the first F-PLL 12 is different from the phase of the third F-PLL signal generated by the third F-PLL 32. The term "third" used herein is replaced with the term "second" in the claims.

According to the above configuration, even if the frequency of the first F-PLL signal and the frequency of the third F-PLL signal are the same, since the phase of the first F-PLL signal and the phase of the third F-PLL signal are different, interference between the first F-PLL signal and the third F-PLL signal can be suppressed.

In addition, in the wireless power transmitting device 10 according to the first embodiment, the phase of the first F-PLL signal generated by the first F-PLL 12 is the same as the phase of the second F-PLL signal generated by the second F-PLL 22, and the first control signal A1 output from the first control circuit 11 and the second control signal A2 output from the second control circuit 21 are different from each other.

According to the above configuration, even if the frequency of the first F-PLL signal and the frequency of the second F-PLL signal are the same, and the phase of the first F-PLL signal and the phase of the second F-PLL signal are the same, the first control signal A1 and the second control signal A2 are different from each other. As a result, interference between the first control signal A1 and the second control signal A2 can be suppressed.

Second Embodiment

In the first embodiment, the configuration in which the frequency of the first F-PLL signal generated by the first F-PLL 12, the frequency of the second F-PLL signal generated by the second F-PLL 22, and the frequency of the third F-PLL signal generated by the third F-PLL 32 are the same has been described. In a second embodiment, a configuration in which the frequency of each F-PLL signal is different will be described.

The second embodiment will be described below with reference to the drawings. Note that, the same reference numerals are given to the components having the same functions as those described in the first embodiment, and the description thereof will be omitted.

Figure 5:
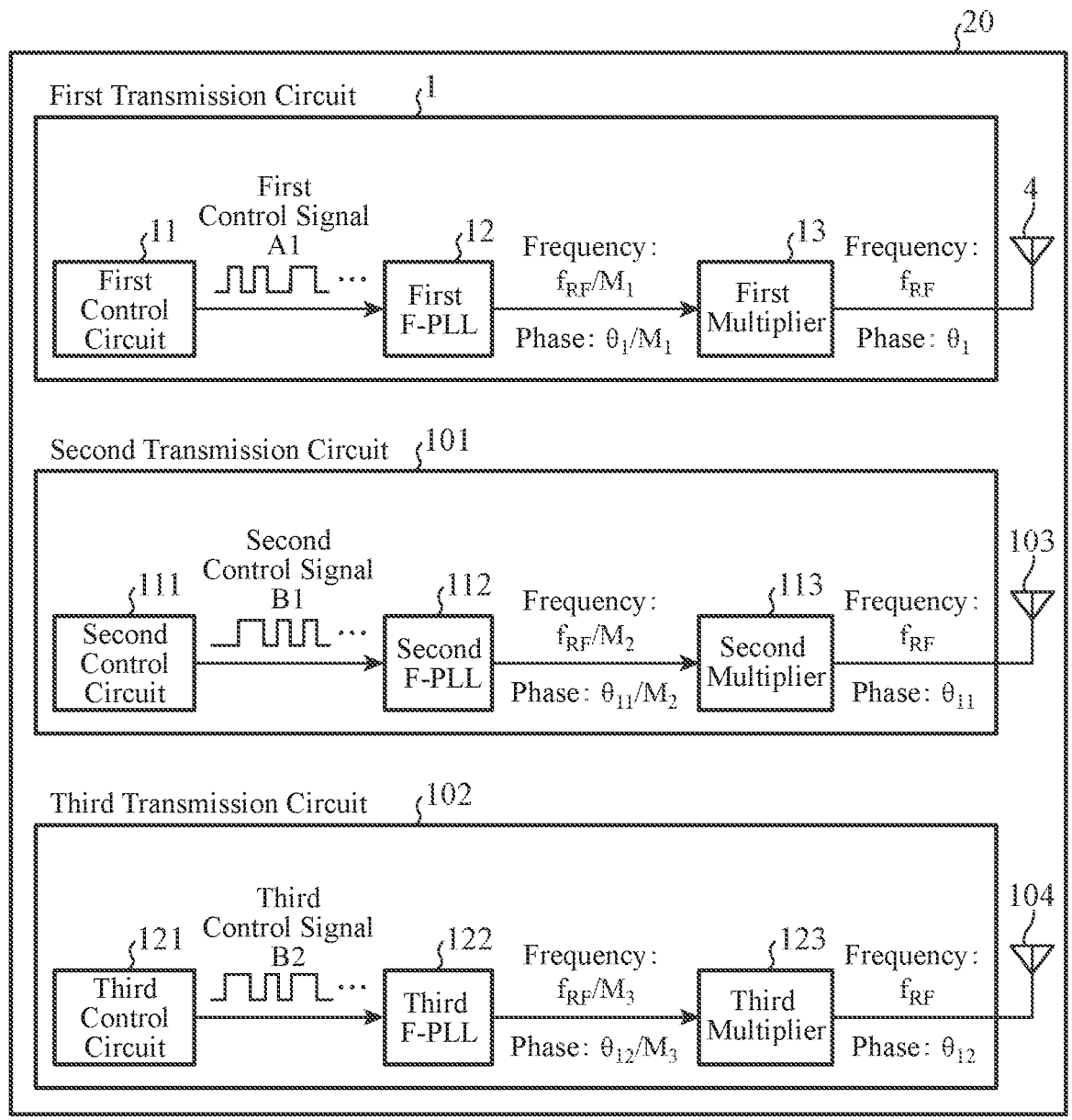
FIG. 5 is a block diagram showing a configuration of a wireless power transmitting device according to a second embodiment.

FIG. 5 is a block diagram illustrating a configuration of a wireless power transmitting device 20 according to the second embodiment. As illustrated in FIG. 5, compared with the wireless power transmitting device 10 according to the first embodiment, the wireless power transmitting device 20 includes a second transmission circuit 101 instead of the second transmission circuit 2, and includes a third transmission circuit 102 instead of the third transmission circuit 3.

In FIG. 5, $f_{RF}$ is a frequency of a transmission signal output from each of a first multiplier 13, and a second multiplier 113 and a third multiplier 123 described later. Further, $\theta_1$ in FIG. 5 is a phase of a first transmission signal output from the first multiplier 13. Further, $\theta_{11}$ in FIG. 5 is a phase of a second transmission signal output from the second multiplier 113 described later. $\theta_{12}$ in FIG. 5 is a phase of a third output signal output from the third multiplier 123 described later. $M_1$ in FIG. 5 is a multiplication number of the first multiplier 13. $M_2$ in FIG. 5 is a multiplication number of the second multiplier 113. $M_3$ in FIG. 5 is a multiplication number of the third multiplier 123. The relation $M_1 \neq M_2 \neq M_3$ is satisfied.

An output terminal of the second transmission circuit 101 is connected to an input terminal of a second antenna 103. The second transmission circuit 101 generates the second transmission signal to be radiated into space by the second antenna 103.

An output terminal of the third transmission circuit 102 is connected to an input terminal of a third antenna 104. The third transmission circuit 102 generates a third transmission signal to be radiated into space by the third antenna 104.

The input terminal of the second antenna 103 is connected to an output terminal of the second multiplier 113. The second antenna 103 radiates the second transmission signal generated by the second transmission circuit 101 into space.

The input terminal of the third antenna 104 is connected to an output terminal of the third multiplier 123. The third antenna 104 radiates the third transmission signal generated by the third transmission circuit 102 into space.

Examples of each of the second antenna 103 and the third antenna 104 include a dipole antenna, a patch antenna, or the like. Alternatively, for example, the plurality of antennas including the second antenna 103 and the third antenna 104 is an array antenna obtained by combining a plurality of element antennas. Although the example has been described above, the second antenna 103 and the third antenna 104 are not limited to the above example, and it suffices that the second antenna 103 and the third antenna 104 each have at least a function of radiating a transmission signal output from a corresponding one of the second multiplier 113 and the third multiplier 123 into space.

Hereinafter, each configuration of the second transmission circuit 101 and the third transmission circuit 102 will be described in more detail.

The second transmission circuit 101 includes a second control circuit 111, a second F-PLL 112, and a second multiplier 113 that is a second frequency conversion circuit.

Note that, in the second embodiment, the configuration in which the second multiplier 113 is used as the second frequency conversion circuit included in the second transmission circuit 101 will be described, but the second frequency conversion circuit included in the second transmission circuit 101 may be a frequency divider.

An output terminal of the second control circuit 111 is connected to a control terminal of the second F-PLL 112. The second control circuit 111 outputs a second control signal B1 for setting the frequency and phase of the second F-PLL signal generated by the second F-PLL 112. In other words, the second control circuit 111 outputs the second control signal B1 being the digital signal that controls the second F-PLL 112 to the second F-PLL 112 so that the second F-PLL 112 generates the second F-PLL signal having the target frequency and the target phase. In the second embodiment, the frequency and phase of the second F-PLL signal set by the second control signal B1 are $f_{RF}/M_2$ and $\theta_{11}/M_2$, respectively.

The second control circuit 11 is, for example, an arithmetic circuit (also referred to as a logic circuit or a digital circuit) such as a field programmable gate array (FPGA). Although the example of the second control circuit 111 has been described above, the second control circuit 111 is not limited to the above example, and it suffices that the second control circuit 111 has at least a function of outputting the second control signal B1 for setting the frequency and phase of the second F-PLL signal generated by the second F-PLL 112. Although not illustrated in FIG. 1, the second control circuit 111 may output the second control signal B1 in synchronization with a reference signal input from the outside.

The second F-PLL 112 has the control terminal connected to the output terminal of the second control circuit 111, and an output terminal connected to an input terminal of the second multiplier 113. The second F-PLL 112 generates a second F-PLL signal having the frequency and phase set by the second control signal B1 output from the second control circuit 111. More specifically, in the second embodiment, the second F-PLL 112 performs generation of the second F-PLL signal, which is a radio frequency signal, and performs phase control of the signal in accordance with the second control signal B1 from the second control circuit 111 in synchronization with an input reference signal (not illustrated). More specifically, in the second embodiment, the second F-PLL 112 outputs the second F-PLL signal having the frequency $f_{RF}/M_2$ and the phase $\theta_{11}/M_2$ to the second multiplier 113 in accordance with the second control signal B1 output from the second control circuit 111 in synchronization with the input reference signal. Note that the reference signal here is, for example, a clock signal having a frequency $f_{RF}$.

The second F-PLL 112 includes, for example, a phase frequency detector (PFD), a loop filter (LF), a voltage controlled oscillator (VCO), and a variable frequency divider. Although the example of the second F-PLL 112 has been described above, the second F-PLL 112 is not limited to the above example, and it suffices that the second F-PLL 112 has at least a function of generating the second F-PLL signal having the frequency and phase set by the second control signal B1 output from the second control circuit 111. Although not illustrated in FIG. 1, the reference signal used by the second F-PLL 112 may be input to the second F-PLL 112 from the outside of the wireless power transmitting device 20, or may be input to the second F-PLL 112 from the second control circuit 111. Alternatively, the second F-PLL 112 may include a reference signal source therein.

The second multiplier 113, which is a second frequency conversion circuit, has an input terminal connected to the output terminal of the second F-PLL 112 and an output terminal connected to the input terminal of the second antenna 103. The second multiplier 113, which is a second frequency conversion circuit, generates a second transmission signal by converting the frequency of the second F-PLL signal generated by the second F-PLL 112. More specifically, in the second embodiment, the second multiplier 113 generates the second transmission signal by multiplying the frequency of the second F-PLL signal generated by the second F-PLL 112. More specifically, in the second embodiment, the second multiplier 113 generates the second transmission signal having the frequency $f_{RF}$ by multiplying the frequency of the second F-PLL signal having the frequency $f_{RF}/M_2$ generated by the second F-PLL 112 by $M_2$. Accordingly, since the phase $\theta_{11}/M_2$ of the second F-PLL signal is multiplied by $M_2$, the phase of the second transmission signal generated by the second multiplier 113 is $\theta_{11}$.

The second multiplier 113 is, for example, a PLL, a mixer, or the like. In a case where the second multiplier 113 is a mixer, the second F-PLL signal generated by the second F-PLL 112 is input to an intermediate frequency (IF) terminal and a local oscillator (LO) of the mixer. Alternatively, for example, the configuration of the second multiplier 113 may be a configuration including a transistor and a filter, in which the transistor performs saturation operation, and the filter passes harmonic components of the input signal to generate the second transmission signal. The multiplication number of the second multiplier 113 may be fixed or variable. The example in which the second frequency conversion circuit is the second multiplier 113 has been described above, but the second frequency conversion circuit is not limited to the above example, and it suffices that the second frequency conversion circuit has at least a function of generating the second transmission signal by converting the frequency of the second F-PLL signal generated by the second F-PLL 112. That is, the second frequency conversion circuit may be a frequency divider that generates the second transmission signal by dividing the frequency of the second F-PLL signal generated by the second F-PLL 112.

The second antenna 103 outputs the second transmission signal generated by the second multiplier 113 that is the second frequency conversion circuit. More specifically, the second antenna 103 radiates the second transmission signal generated by the second multiplier 113 into space.

The third transmission circuit 102 includes a third control circuit 121, a third F-PLL 122, and a third multiplier 123 that is a third frequency conversion circuit.

Note that, in the second embodiment, a configuration in which the third multiplier 123 is used as the third frequency conversion circuit included in the third transmission circuit 102 will be described, but the third frequency conversion circuit included in the third transmission circuit 102 may be a frequency divider.

An output terminal of the third control circuit 121 is connected to a control terminal of the third F-PLL 122. The third control circuit 121 outputs a third control signal B2 for setting the frequency and phase of the third F-PLL signal generated by the third F-PLL 122. In other words, the third control circuit 121 outputs the third control signal B2 being the digital signal that controls the third F-PLL 122 to the third F-PLL 122 so that the third F-PLL 122 generates the third F-PLL signal having the target frequency and the target phase. In the second embodiment, the frequency and phase of the third F-PLL signal set by the third control signal B2 are $f_{RF}/M_3$ and $\theta_{12}/M_3$, respectively.

The third control circuit 121 is, for example, an arithmetic circuit (also referred to as a logic circuit or a digital circuit) such as a field programmable gate array (FPGA). Although the example of the third control circuit 121 has been described above, the third control circuit 121 is not limited to the above example, and it suffices that the third control circuit 121 has at least a function of outputting the third control signal B2 for setting the frequency and phase of the third F-PLL signal generated by the third F-PLL 122. Although not illustrated in FIG. 1, the third control circuit 121 may output the third control signal B2 in synchronization with a reference signal input from the outside.

The third F-PLL 122 has the control terminal connected to the output terminal of the third control circuit 121 and an output terminal connected to the input terminal of the third multiplier 123. The third F-PLL 122 generates a third F-PLL signal having a frequency and a phase set by the third control signal B2 output from the third control circuit 121. More specifically, in the second embodiment, the third F-PLL 122 performs generation of the third F-PLL signal, which is a radio frequency signal, and performs phase control of the signal in accordance with the third control signal B2 from the third control circuit 121 in synchronization with an input reference signal (not illustrated). More specifically, in the second embodiment, the third F-PLL 122 outputs the third F-PLL signal having the frequency $f_{RF}/M_3$ and the phase $\theta_{12}/M_3$ to the third multiplier 123 in accordance with the third control signal B2 output from the third control circuit 121 in synchronization with the input reference signal. Note that the reference signal here is, for example, a clock signal having a frequency $f_{RF}$.

The third F-PLL 122 includes, for example, a phase frequency detector (PFD), a loop filter (LF), a voltage controlled oscillator (VCO), and a variable frequency divider. Although the example of the third F-PLL 122 has been described above, the third F-PLL 122 is not limited to the above example, and it suffices that the third F-PLL 122 has at least a function of generating the third F-PLL signal having the frequency and phase set by the third control signal B2 output from the third control circuit 121. Although not illustrated in FIG. 1, the reference signal used by the third F-PLL 122 may be input to the third F-PLL 122 from the outside of the wireless power transmitting device 20, or may be input to the third F-PLL 122 from the third control circuit 121. Alternatively, the third F-PLL 122 may include a reference signal source therein.

The third multiplier 123, which is a third frequency conversion circuit, has an input terminal connected to the output terminal of the third F-PLL 122 and an output terminal connected to the input terminal of the third antenna 104. The third multiplier 123, which is the third frequency conversion circuit, generates a third transmission signal by converting the frequency of the third F-PLL signal generated by the third F-PLL 122. More specifically, in the second embodiment, the third multiplier 123 generates the third transmission signal by multiplying the frequency of the third F-PLL signal generated by the third F-PLL 122. More specifically, in the second embodiment, the third multiplier 123 generates the third transmission signal having the frequency $f_{RF}$ by multiplying the frequency of the third F-PLL signal having the frequency $f_{RF}/M_3$ generated by the third F-PLL 122 by $M_3$. Accordingly, since the phase $\theta_{12}/M_3$ of the third F-PLL signal is multiplied by $M_3$, the phase of the third transmission signal generated by the third multiplier 123 is $\theta_{12}$.

The third multiplier 123 is, for example, a PLL, a mixer, or the like. In a case where the third multiplier 123 is a mixer, the third F-PLL signal generated by the third F-PLL 122 is input to an intermediate frequency (IF) terminal and a local oscillator (LO) of the mixer. Alternatively, for example, the configuration of the third multiplier 123 may be a configuration including a transistor and a filter, in which the transistor performs saturation operation, and the filter passes harmonic components of the input signal to generate the third transmission signal. The multiplication number of the third multiplier 123 may be fixed or variable. The example in which the third frequency conversion circuit is the third multiplier 123 has been described above, but the third frequency conversion circuit is not limited to the above example, and it suffices that the third frequency conversion circuit has at least a function of generating the third transmission signal by converting the frequency of the third F-PLL signal generated by the third F-PLL 122. That is, the third frequency conversion circuit may be a frequency divider that generates the third transmission signal by dividing the frequency of the third F-PLL signal generated by the third F-PLL 122.

The third antenna 104 outputs the third transmission signal generated by the third multiplier 123 that is the third frequency conversion circuit. More specifically, the third antenna 104 radiates the third transmission signal generated by the third multiplier 123 into space.

As described above, in the second embodiment, the frequency ($f_R F/M_1$) of the first F-PLL signal generated by the first F-PLL 12, the frequency ($f_{RF}/M_2$) of the second F-PLL signal generated by the second F-PLL 112, and the frequency ($f_{RF}/M_3$) of the third F-PLL signal generated by the third F-PLL 122 are different.

In the second embodiment, the first multiplier 13 that is the first frequency conversion circuit, the second multiplier 113 that is the second frequency conversion circuit, and the third multiplier 123 that is the third frequency conversion circuit have different multiplication numbers ($M_1 \neq M_2 \neq M_3$). Unlike the first embodiment, when each of the first frequency conversion circuit, the second frequency conversion circuit, and the third frequency conversion circuit is a frequency divider, the first frequency divider included in the first transmission circuit 1, the second frequency divider included in the second transmission circuit 101, and the third frequency divider included in the third transmission circuit 102 have different frequency division numbers. In other words, when the wireless power transmitting device 20 includes the first frequency divider, the second frequency divider, and the third frequency divider instead of the first multiplier 13, the second multiplier 113, and the third multiplier 123, the frequency division number of the first frequency divider, the frequency division number of the second frequency divider, and the frequency division number of the third frequency divider are the same. In addition, in a case where a frequency divider that divides by $N_1$ is used as the first frequency divider, the second frequency divider, and the third frequency divider, the frequency of the transmission signal generated by the frequency divider is a value of $1/N_1$ of the frequency of the F-PLL signal, and the phase is also a value of $1/N_1$ of the frequency of the F-PLL signal. Therefore, when the frequency of the target transmission signal is $f_{RF}$ and the phase of the target transmission signal is $\theta_1$, the frequency of the F-PLL signal is $N_1 \cdot f_{RF}$ and the phase is $N_1 \cdot \theta_1$.

Also in the second embodiment, the frequency of the first transmission signal generated by the first frequency conversion circuit and output from the first antenna 4, the frequency of the second transmission signal generated by the second frequency conversion circuit and output from the second antenna 103, and the frequency of the third transmission signal generated by the third frequency conversion circuit and output from the third antenna 104 are the same (fa).

Although not illustrated in FIG. 5, the reference signals input to the first F-PLL 12, the second F-PLL 112, and the third F-PLL 122 may be the same signal or different signals. That is, the phases of the respective reference signals input to the first F-PLL 12, the second F-PLL 112, and the third F-PLL 122 may be the same or different. The frequencies of the respective reference signals input to the first F-PLL 12, the second F-PLL 112, and the third F-PLL 122 may be the same or different.

Hereinafter, the operation of the wireless power transmitting device 20 according to the second embodiment will be described. In the description of the operation, it is assumed that the wireless power transmitting device 20 includes the first F-PLL 12 illustrated in FIG. 2, and the second F-PLL 112 and the third F-PLL 122 each having a configuration similar to the configuration of the first F-PLL 12 illustrated in FIG. 2. In addition, it is assumed that the above-described reference signal is input to each of the first F-PLL 12, the second F-PLL 112, and the third F-PLL 122 from the outside of the wireless power transmitting device 20.

First, the first control circuit 11 sets the frequency of the first F-PLL signal generated by the first F-PLL 12 to $f_{RF}/M_1$ and outputs the first control signal A1 for setting the phase of the first F-PLL signal to $\theta_1/M_1$ to the first F-PLL 12.

Next, the first F-PLL 12 generates a first F-PLL signal having a frequency $f_{RF}/M_1$ and a phase $\theta_1/M_1$ set by the first control signal A1 output from the first control circuit 11. The first F-PLL 12 outputs the generated first F-PLL signal to the first multiplier 13.

Next, the first multiplier 13 multiplies the frequency of the first F-PLL signal generated by the first F-PLL 12 by $M_1$ to generate a first transmission signal having a frequency $f_{RF}$ and a phase $\theta_1$. The first multiplier 13 outputs the generated first transmission signal to the first antenna 4.

Next, the first antenna 4 radiates the first transmission signal generated by the first multiplier 13 into space.

On the other hand, the second control circuit 111 sets the frequency of the second F-PLL signal generated by the second F-PLL 112 to $f_{RF}/M_2$, and outputs the second control signal B1 for setting the phase of the second F-PLL signal to $\theta_{11}/M_2$ to the second F-PLL 112.

Next, the second F-PLL 112 generates a second F-PLL signal having a frequency $f_{RF}/M_2$ and a phase $\theta_{11}/M_2$ set by the second control signal B1 output from the second control circuit 111. The second F-PLL 112 outputs the generated second F-PLL signal to the second multiplier 113.

Next, the second multiplier 113 multiplies the frequency of the second F-PLL signal generated by the second F-PLL 112 by $M_2$ to generate a second transmission signal having a frequency $f_{RF}$ and a phase $\theta_{11}$. The second multiplier 113 outputs the generated second transmission signal to the second antenna 103.

Next, the second antenna 103 radiates the second transmission signal generated by the second multiplier 113 into space.

On the other hand, the third control circuit 121 sets the frequency of the third F-PLL signal generated by the third F-PLL 122 to $f_{RF}/M_3$, and outputs the third control signal B2 for setting the phase of the third F-PLL signal to $\theta_{12}/M_3$ to the third F-PLL 122.

Next, the third F-PLL 122 generates a third F-PLL signal having a frequency $f_{RF}/M_3$ and a phase $\theta_{12}/M_3$ set by the third control signal B2 output from the third control circuit 121. The third F-PLL 122 outputs the generated third F-PLL signal to the third multiplier 123.

Next, the third multiplier 123 multiplies the frequency of the third F-PLL signal generated by the third F-PLL 122 by $M_3$ to generate a third transmission signal having a frequency $f_{RF}$ and a phase θ12. The third multiplier 123 outputs the generated third transmission signal to the third antenna 104.

Next, the third antenna 104 radiates the third transmission signal generated by the third multiplier 123 into space.

Although in the above description of the second embodiment, an example in which the wireless power transmitting device 20 includes three transmission circuits has been described, it suffices that the wireless power transmitting device 20 includes at least two or more transmission circuits.

Further, in the second embodiment, the configuration in which the multiplication numbers of the respective multipliers included in the wireless power transmitting device 20 satisfy $M_1 \neq M_2 \neq M_3$ has been described. However, for example, some multiplication numbers may be the same such as $M_1=M_2 \neq M_3$. When some multiplication numbers are the same, the first modification described in the first embodiment may be applied to the wireless power transmitting device 20. In that case, for example, the phase of the first transmission signal generated by the first multiplier 13 and output from the first antenna 4 is the same as the phase of the third transmission signal generated by the third multiplier 123 that is the third frequency conversion circuit and output from the third antenna 104. On the other hand, the phase of the first F-PLL signal generated by the first F-PLL 12 of the first transmission circuit 1 is different from the phase of the third F-PLL signal generated by the third F-PLL 122 of the third transmission circuit 102. As a result, even if the frequency of the first F-PLL signal and the frequency of the third F-PLL signal are the same, since the phase of the first F-PLL signal and the phase of the third F-PLL signal are different, it is possible to suppress interference in which the first F-PLL signal and the third F-PLL signal intensify each other.

In addition, the second modification described in the first embodiment may be applied to the wireless power transmitting device 20. In that case, for example, the phase of the first F-PLL signal generated by the first F-PLL 12 and the phase of the second F-PLL signal generated by the second F-PLL 112 are the same. On the other hand, the first control signal A1 output from the first control circuit 11 and the second control signal B1 output from the second control circuit 111 are different from each other. As a result, even when the frequency of the first F-PLL signal and the frequency of the second F-PLL signal are the same, and the phase of the first F-PLL signal and the phase of the second F-PLL signal are the same, the first control signal A1 and the second control signal B1 are different from each other. As a result, interference between the first control signal A1 and the second control signal B1 can be suppressed.

As described above, in the wireless power transmitting device 20 according to the second embodiment, the frequency of the first F-PLL signal generated by the first F-PLL 12 is different from the frequency of the second F-PLL signal generated by the second F-PLL 112, the first frequency conversion circuit (first multiplier 13) and the second frequency conversion circuit (second multiplier 113) have different multiplication numbers or frequency division numbers, and the frequency of the first transmission signal generated by the first frequency conversion circuit and output from the first antenna 4 and the frequency of the second transmission signal generated by the second frequency conversion circuit and output from the second antenna 103 are the same.

According to the above configuration, since the frequency of the first F-PLL signal is different from the frequency of the second F-PLL signal generated by the second F-PLL 112, interference between the first F-PLL signal and the second F-PLL signal can be suppressed.

Note that it is possible to freely combine the embodiments, to modify any components of the embodiments, or to omit any components in the embodiments.

INDUSTRIAL APPLICABILITY

Since the wireless power transmitting device according to the present disclosure can suppress interference between signals of the same frequency in the wireless power transmitting device, the wireless power transmitting device can be applied to a technique of wireless power transmission.

REFERENCE SIGNS LIST

1: first transmission circuit, 2: second transmission circuit, 3: third transmission circuit, 4: first antenna, 5: second antenna, 6: third antenna, 10: wireless power transmitting device, 11: first control circuit, 12: first F-PLL, 13: first multiplier, 20: wireless power transmitting device, 21: second control circuit, 22: second F-PLL, 23: second multiplier, 31: third control circuit, 32: third F-PLL, 33: third multiplier, 41: PFD, 42: LF, 43: VCO, 44: variable frequency divider, 101: second transmission circuit, 102: third transmission circuit, 103: second antenna, 104: third antenna, 111: second control circuit, 112: second F-PLL, 113: second multiplier, 121: third control circuit, 122: third F-PLL, 123: third multiplier, A1: first control signal, A2: second control signal, A3: third control signal, B1: second control signal, B2: third control signal,

The invention claimed is:

1. A wireless power transmitting device comprising: a plurality of transmission circuits to each generate a transmission signal; and a plurality of antennas to each output the transmission signal generated by a corresponding one of the plurality of transmission circuits, wherein
    each of the plurality of transmission circuits includes a control circuit, an F-PLL, and a frequency conversion circuit,
    the control circuit outputs a control signal for setting a frequency and a phase of an F-PLL signal generated by the F-PLL,
    the F-PLL generates the F-PLL signal having the frequency and the phase set by the control signal output from the control circuit,
    the frequency conversion circuit generates the transmission signal by converting a frequency of the F-PLL signal generated by the F-PLL,
    the plurality of transmission circuits includes a first transmission circuit and a second transmission circuit,
    the plurality of antennas includes a first antenna connected to the first transmission circuit and a second antenna connected to the second transmission circuit,
    the first transmission circuit includes a first control circuit, a first F-PLL, and a first frequency conversion circuit,
    the first control circuit outputs a first control signal for setting a frequency and a phase of a first F-PLL signal generated by the first F-PLL by setting a setting pattern of a frequency division number in the first F-PLL,
    the first F-PLL generates the first F-PLL signal having a frequency and a phase set by the first control signal output from the first control circuit,
    the first frequency conversion circuit generates a first transmission signal by converting the frequency of the first F-PLL signal generated by the first F-PLL,
    the first antenna outputs the first transmission signal generated by the first frequency conversion circuit,
    the second transmission circuit includes a second control circuit, a second F-PLL, and a second frequency conversion circuit,
    the second control circuit outputs a second control signal for setting a frequency and a phase of a second F-PLL signal generated by the second F-PLL by setting a setting pattern of a frequency division number in the second F-PLL,
    the second F-PLL generates the second F-PLL signal having the frequency and the phase set by the second control signal output from the second control circuit,
    the second frequency conversion circuit generates a second transmission signal by converting a frequency of the second F-PLL signal generated by the second F-PLL, the second antenna outputs the second transmission signal generated by the second frequency conversion circuit, the frequency of the first F-PLL signal generated by the first F-PLL is the same as the frequency of the second F-PLL signal generated by the second F-PLL, the first frequency conversion circuit and the second frequency conversion circuit have a same multiplication number or frequency division number, a frequency of the first transmission signal generated by the first frequency conversion circuit and output from the first antenna is the same as a frequency of the second transmission signal generated by the second frequency conversion circuit and output from the second antenna, a phase of the first F-PLL signal generated by the first F-PLL is the same as a phase of the second F-PLL signal generated by the second F-PLL, and the setting pattern of the frequency division number in the first F-PLL set by the first control signal output from the first control circuit and the setting pattern of the frequency division number in the second F-PLL set by the second control signal output from the second control circuit are different from each other.

2. The wireless power transmitting device according to claim 1, wherein the F-PLL includes a PFD to generate a PFD signal on a basis of a reference signal, an LF to generate an LF signal on a basis of the PFD signal, a VCO to generate an oscillation signal on a basis of the LF signal, and a variable frequency divider to generate a frequency-divided signal on a basis of the oscillation signal, the PFD generates the PFD signal corresponding to a phase difference between the reference signal and the frequency-divided signal by comparing a phase of the reference signal with a phase of the frequency-divided signal generated by the variable frequency divider, the LF generates the LF signal having a control voltage for the VCO by smoothing the PFD signal generated by the PFD, the VCO generates the oscillation signal as the F-PLL signal by controlling an oscillation frequency on a basis of the control voltage of the LF signal generated by the LF, and the variable frequency divider generates the frequency-divided signal by frequency-dividing the oscillation signal generated by the VCO on a basis of the control signal output from the control circuit.

* * * * *